(12) United States Patent
Alexander et al.

(10) Patent No.: US 9,787,304 B2
(45) Date of Patent: Oct. 10, 2017

(54) METHODS, SYSTEMS, AND DEVICES FOR ACTIVE CHARGE CONTROL DIODES

(71) Applicant: Ideal Power Inc., Austin, TX (US)

(72) Inventors: William C. Alexander, Spicewood, TX (US); Richard A. Blanchard, Los Altos, CA (US)

(73) Assignee: Ideal Power, Inc., Austin, TX (US)

( * ) Notice: Subject to any disclaimer, the term of this patent is extended or adjusted under 35 U.S.C. 154(b) by 0 days.

(21) Appl. No.: 14/945,097

(22) Filed: Nov. 18, 2015

(65) Prior Publication Data

US 2016/0277022 A1    Sep. 22, 2016

Related U.S. Application Data

(60) Provisional application No. 62/081,474, filed on Nov. 18, 2014, provisional application No. 62/094,435, filed on Dec. 19, 2014, provisional application No. 62/236,492, filed on Oct. 2, 2015, provisional application No. 62/239,815, filed on Oct. 9, 2015.

(51) Int. Cl.
| | |
|---|---|
| *H03K 17/74* | (2006.01) |
| *H01L 29/872* | (2006.01) |
| *H01L 29/861* | (2006.01) |
| *H03K 17/16* | (2006.01) |

(52) U.S. Cl.
CPC ......... *H03K 17/74* (2013.01); *H01L 29/8613* (2013.01); *H01L 29/872* (2013.01); *H03K 17/16* (2013.01)

(58) Field of Classification Search
CPC .............................. H03K 17/74; H01L 29/872
See application file for complete search history.

(56) References Cited

U.S. PATENT DOCUMENTS

| | | | | |
|---|---|---|---|---|
| 9,054,708 | B2 * | 6/2015 | Kim ....................... | H03K 17/96 |
| 9,130,567 | B2 * | 9/2015 | Yun ........................ | H03K 19/20 |
| 2011/0215858 | A1 * | 9/2011 | Mauder ................. | H01L 29/739 |
| | | | | 327/377 |

* cited by examiner

*Primary Examiner* — Kenneth B Wells
(74) *Attorney, Agent, or Firm* — Gwendolyn G. Corcoran; Robert O. Groover, III; Groover & Associates PLLC

(57) ABSTRACT

Methods and systems for active charge control diodes with improved reverse recovery characteristics. An extra control terminal is added on the side of a diode nearest to its p-n junction. The control terminal connects to a control region which extends from the drift region to the cathode surface and which is most preferably separated from the cathode region by an insulated trench. During turn-off, the control terminal is most preferably driven negative relative to the cathode just before reversing the polarity of the applied external voltage.

5 Claims, 8 Drawing Sheets

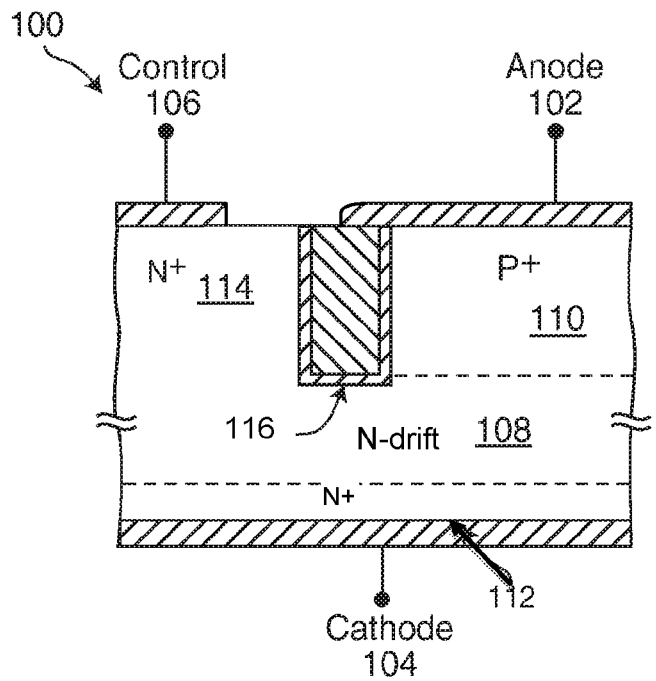
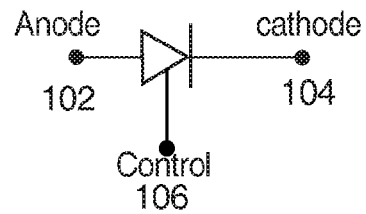
FIG. 1B
FIG. 1A
  t = 0 to t₁
  t = t₁ to t₂
  t = t₂+

METHODS, SYSTEMS, AND DEVICES FOR ACTIVE CHARGE CONTROL DIODES

CROSS-REFERENCE

Priority is claimed from 62/081,474 filed Nov. 18, 2014, 62/094,435 filed Dec. 19, 2014, 62/236,492 filed Oct. 2, 2015, and 62/239,815 filed Oct. 9, 2015, all of which are as of the effective filing date of the present application, and all of which are hereby incorporated by reference.

BACKGROUND

The present application relates to semiconductor devices, and more particularly to power diodes and switching modules.

Note that the points discussed below may reflect the hindsight gained from the disclosed inventions, and are not necessarily admitted to be prior art.

Conventionally, diodes provide charge-blocking capabilities, but suffer from the reverse recovery charge problem. That is, when a conventional diode is active and conducting current (in the appropriate direction), turn-off produces an undesirably-large reverse current to equilibrize the induced voltage difference, which can negatively impact performance. Conventionally, diodes deal with this problem by minimizing minority carrier lifetimes in the diode.

The present application teaches, among other innovations, diodes with an added control terminal, and methods of operating controllable diodes to reduce recovery charge. Most preferable a control terminal is added on the side of a diode closest to its p-n junction, and is separated from the junction region by an insulated trench. In preferred operation methods, the control terminal is driven to reduce the minority carrier density before the zero-crossing of current.

In one class of embodiments, the control terminal is driven toward a voltage which is not within the range of the anode and cathode voltages.

For example, in one class of embodiments, the semiconductor die is p-type, and the control terminal is located on the same surface with the cathode terminal. In a modification of this embodiment, the control terminal is optionally driven to a voltage which is slightly more negative than the cathode terminal.

In another class of embodiments, the semiconductor die is n-type, and the control terminal is located on the same surface with the anode terminal. In a modification of this embodiment, the control terminal is optionally driven to a voltage which is slightly more positive than the anode terminal.

BRIEF DESCRIPTION OF THE DRAWINGS

The disclosed inventions will be described with reference to the accompanying drawings, which show important sample embodiments and which are incorporated in the specification hereof by reference, wherein:

FIG. 1A shows one presently-preferred sample embodiment of the present inventions.

FIG. 1B shows an example of a circuit symbol for a device like that of FIG. 1A.

DETAILED DESCRIPTION OF SAMPLE EMBODIMENTS

Figure 2A:
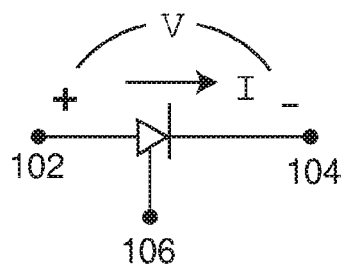
FIGS. 2A, 2B, and 2C schematically show one sample method of controlling conduction for a device like that of FIG. 1A.

The numerous innovative teachings of the present application will be described with particular reference to presently preferred embodiments (by way of example, and not of limitation). The present application describes several inventions, and none of the statements below should be taken as limiting the claims generally.

The present inventors have realized that, rather than minimizing minority carrier lifetimes, reverse recovery behavior is advantageously improved by depleting the minority carrier population before turn-off.

During normal on-state operations, the control terminal is held inactive. Turn-off begins by bringing the control terminal negative relative to the cathode. Minority carriers are injected through the control terminal into the diode's drift region to recombine with a large fraction of majority carriers, while the remaining majority carriers are swept out of the drift region through the terminal opposite the junction side. The depletion region that builds up on the reverse-biased junction mostly prevents reverse recovery current, though some relatively small reverse recovery current corresponding to the induced voltage differential between terminals is still possible. Activation of the control terminal most preferably brings the control terminal negative relative to the cathode just before reversing the external voltage polarity, but can less preferably simply short the control region to the cathode region.

An Active Charge Control (ACC) diode is a PN-junction diode with an extra terminal, which is used for controlling the amount of stored charge within the drift region of the device. It can be implemented in a variety of semiconductor materials (e.g. silicon, SiC, etc.) and also with either polarity (P or N) of doping within the drift region. The inventive devices of the present application are preferably constructed by forming a shallow diffusion of a first polarity dopant on the top surface of a second-polarity-doped wafer. An opening on the top surface of the wafer makes direct contact with the second polarity portion of the wafer.

With the control terminal open, the device functions as a standard PN diode, capable of conducting forward current from anode to cathode (forward conduction), and blocking voltage from cathode to anode (reverse blocking). However, when transitioning from forward conduction to reverse blocking, a "reverse recovery" current flows briefly from cathode to anode, which removes the charge carriers stored in the drift region. This reverse recovery current can cause significant conductive losses and other difficulties in power converters using these kinds of diodes.

Standard PN diodes mitigate this reverse recovery current by having a short minority carrier lifetime within the drift region, but this causes a higher voltage drop during forward conduction, and may also require a larger diode.

The ACC diodes described herein can greatly reduce reverse recovery current by using the control terminal to reduce the charge carrier density during forward conduction and just prior to reverse recovery. In one class of embodiments, this can be done by shorting the control terminal to the cathode, e.g. by external electronic means such as a MOSFET. When the control and cathode terminals are shorted while the device is forward conducting, current is diverted from the PN junction directly to the cathode. This halts minority carrier injection from the PN junction into the drift region, and can even result in a reversal of current through the PN junction. When such a current reversal occurs, minority carriers flow back into the cathode, which rapidly clears the drift region of minority carriers. Majority carriers are removed through the control terminal during this period.

After most charge carriers are removed, reverse recovery starts when the voltage across the device is reversed by the external circuit. Simultaneously with this voltage reversal, the control terminal is opened. Very little reverse current flows as the depletion region builds up on the reversed biased PN junction, and the device blocks reverse voltage. Losses due to reverse recovery current are thereby greatly reduced, while preserving a low forward voltage drop at high current density due to having a long minority carrier lifetime in the drift region.

While blocking reverse voltage, a voltage is developed between the cathode and the control terminal, but this voltage is small compared with the total device blocking voltage.

A poly-filled and oxide-insulated trench between the control and cathode contacts serves to maximize gain and reduce the afore-mentioned control to cathode voltage during reverse blocking.

Since this is a single sided device, it is compatible with standard power semiconductor manufacturing and packaging.

The sample active charge control (ACC) diode 100 of FIG. 1A is the presently-preferred polarity configuration. Anode terminal 102 is connected to p+ anode region 110. Cathode terminal 104 and control terminal 106 connect respectively to n+ cathode region 112 and n+ control region 114, which are both the same conductivity type as n-drift region 108. Oxide-filled trench 116 separates control region 114 from anode region 110. A sample circuit symbol for n-drift ACC devices like that of FIG. 1A can be seen in FIG. 1B. Here, control terminal 106 is shown connected to the anode side of the diode symbol, indicating that anode terminal 102 and control terminal 106 are connected to the same side of the device.

Figure 2B:
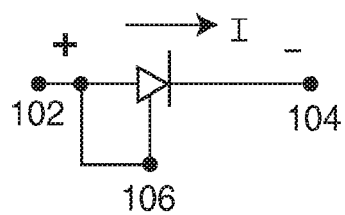
Figure 2C:
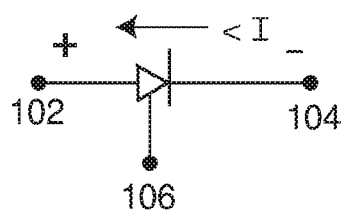

During normal forward conduction, as seen in FIG. 2A, from t=0 to t=t1 (as given in the corresponding timing diagram of FIG. 3), control terminal 106 is inactive. Current flows between anode 102 and cathode 104 as for a conventional diode. Pre-turn-off begins, in FIG. 2B, by shorting control terminal 106 to anode terminal 102 at time t1<t<t2. At time t=t2, a small reverse recovery current flows from cathode 104 to anode 102, as seen in FIG. 2C. This reverse recovery current is much less in magnitude than is the case in conventional diodes.

Figure 3:
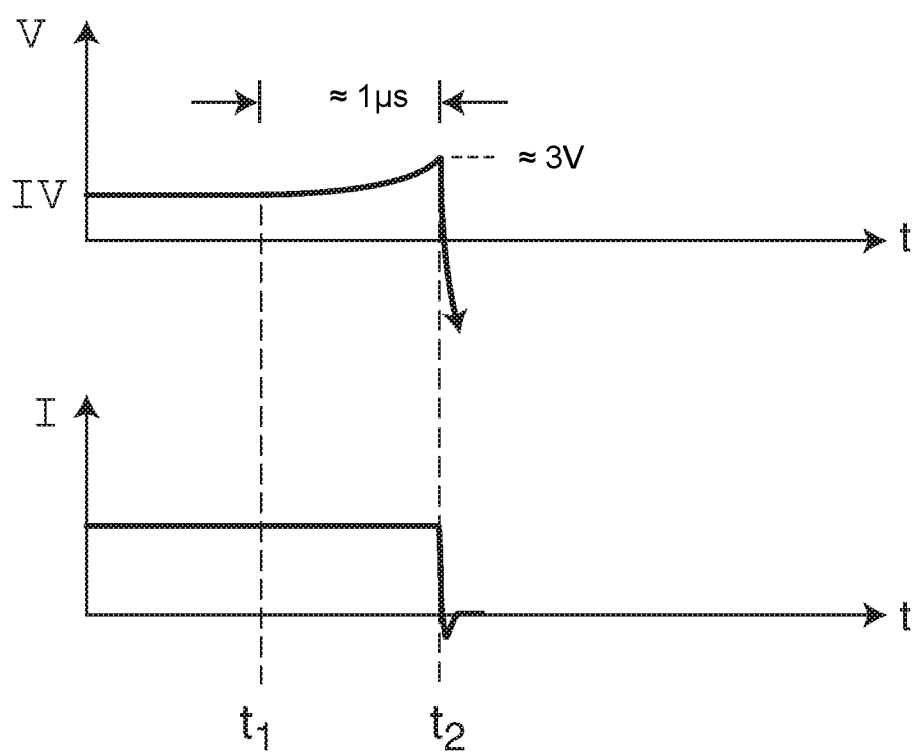
FIG. 3 shows an exemplary timing diagram corresponding to the sample control method of FIGS. 2A-2C.

In the sample timing diagram of FIG. 3, reverse recovery behavior is improved by minimizing the magnitude of the negative current spike at and just after time t2.

Figure 4:
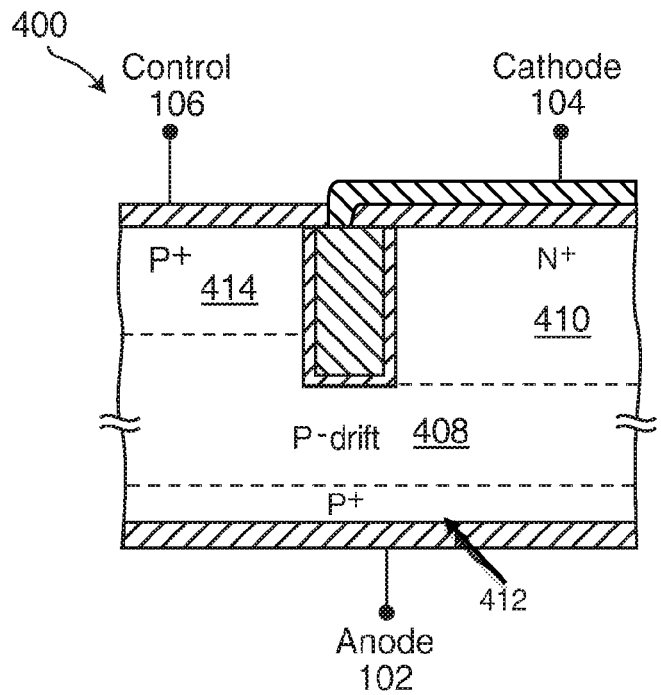
FIG. 4 shows another sample embodiment of the present inventions.
Figure 5:
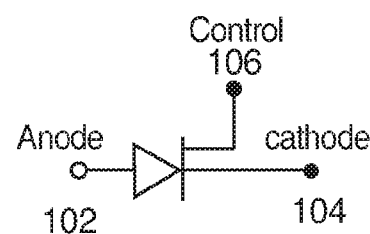
FIG. 5 shows a sample circuit symbol for a device like that of FIG. 4.
Figure 6A:
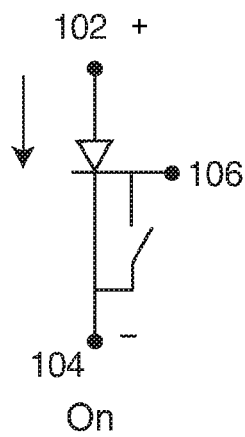
FIGS. 6A, 6B, and 6C show the stages of a sample control flow for a device like that of FIG. 4.
Figure 6B:
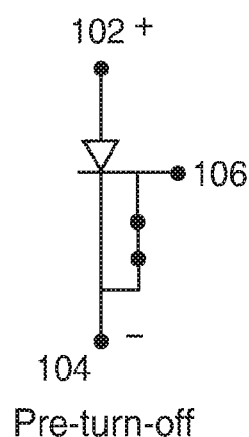
Figure 6C:
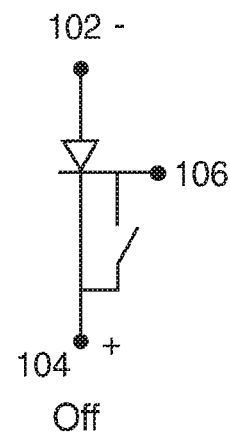

In comparing sample device 400 of FIG. 4 with that of FIG. 1, it can be seen that control region is on the same side of the device as the p-n junction in both cases. Here, p+ control region 414 is on the same side of the device as n+ cathode region 410. As before, control region 414, p-drift region 408, and p+ anode region 412 have the same conductivity type. The sample circuit symbol of FIG. 5 reflects the change in polarity: here, control terminal 106 is shown on the cathode side of the diode symbol, indicating that control terminal 106 is on the cathode side of device 400. As with FIGS. 2A-2C, the sample embodiments of FIGS. 6A, 6B, and 6C indicate forward conduction, pre-turn-off, and reverse blocking stages for one sample method of controlling a p-drift ACC diode like that of FIG. 4.

Figure 7:
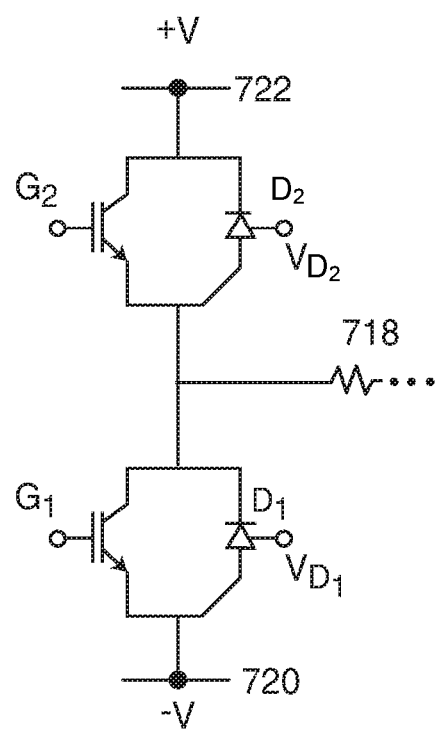
FIG. 7 shows one sample embodiment implementing the teachings of the instant application.
Figure 8:
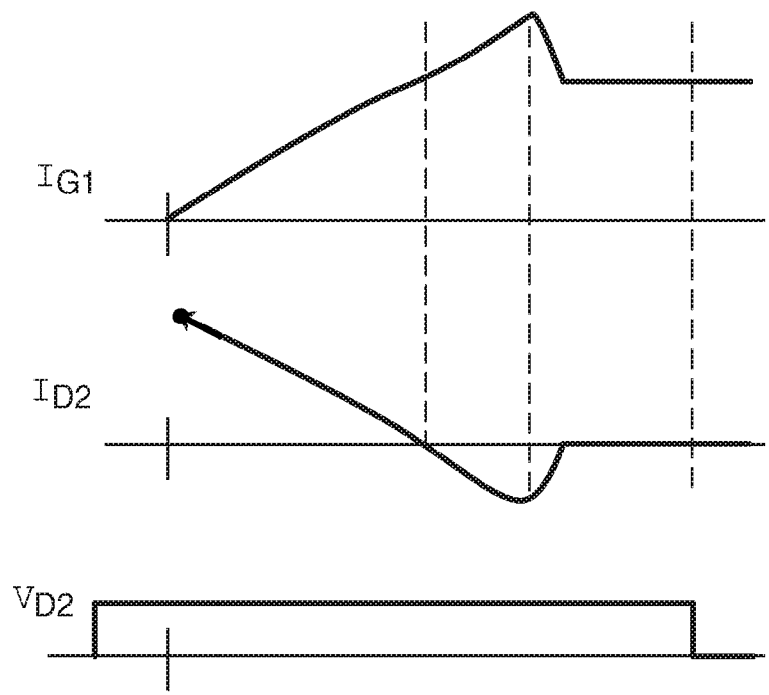
FIG. 8 shows a sample timing diagram for the system of FIG. 7A.

The sample embodiment of FIG. 7 shows ACC diodes according to the instant inventions being used in a phase leg for a power-packet-switching power converter. This class of power converters was disclosed in e.g. U.S. Pat. No. 7,599,196, which is hereby incorporated by reference in its entirety. IGBT G1 and anti-parallel ACC diode D1 lie between line 718 and negative rail 720, while IGBT G2 and anti-parallel ACC diode D2 lie between line 718 and positive rail 722. While ACC diodes D1 and D2 are shown as n-drift devices, they can also be p-drift diodes. As seen in the sample timing diagrams of FIG. 8, the currents on IGBT G1 and ACC diode D2 are active at the same time, and run negative to each other, albeit from different initial offsets. Meanwhile, the voltage on ACC diode D2 remains constant from before the currents on G1 and D2 begin changing, to after both currents later stabilize.

Figure 9:
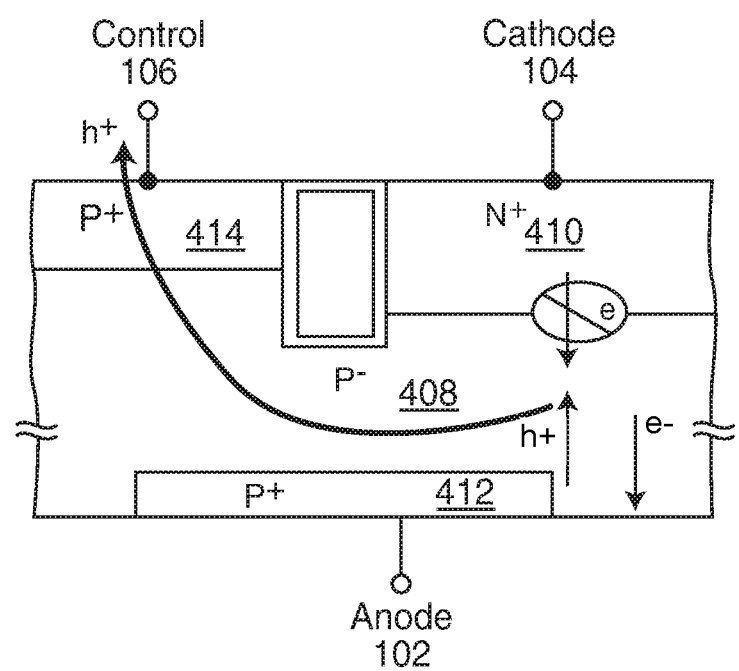
FIG. 9 shows one example of carrier flow at the start of turn-off for a device like that of FIG. 4.

In the sample current flow sketch of FIG. 9, when control terminal 106 goes active in a p-drift ACC diode like that of FIG. 4, minority carrier injection of electrons from cathode region 410 stops. Excess drift region minority carriers (electrons e−) are rapidly removed from drift region 408, while majority carriers (holes h+) are swept out through control terminal 106.

Figure 10:
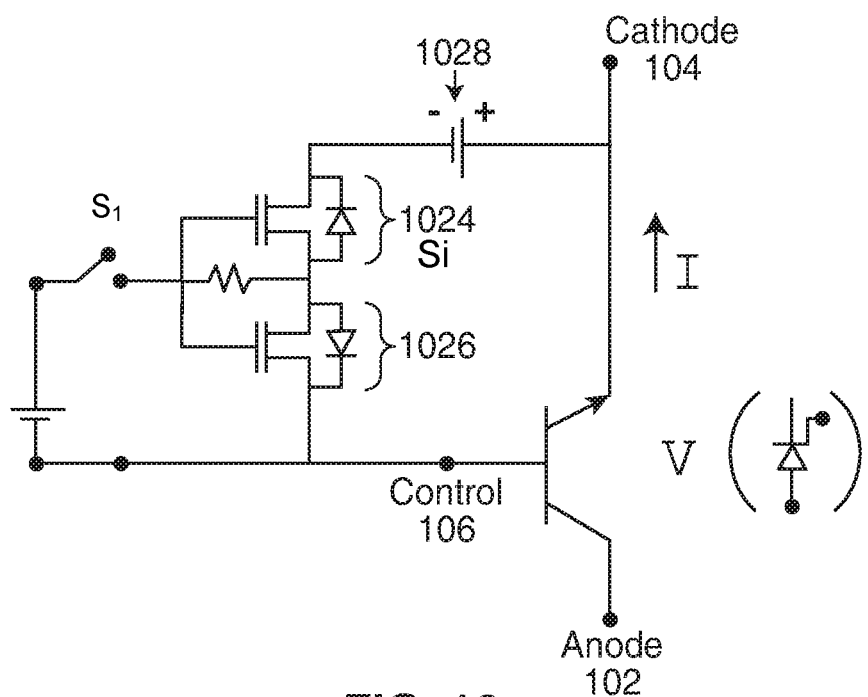
FIG. 10 schematically shows one sample embodiment which provides improved turn-off for the present inventions.

The sample embodiment of FIG. 10 is a significant improvement for the ACC diode. It involves, for a p-drift ACC diode, driving the control terminal negative relative to the cathode just before reversing current flow. For an n-drift ACC diode, this instead means driving the control terminal positive relative to the anode just before reversing current flow.

Figure 11A:
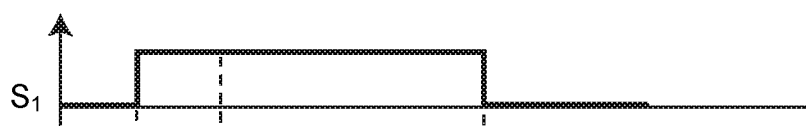
FIGS. 11A, 11B, and 11C show sample timing diagrams for turn-off using the sample embodiment of FIG. 10.
Figure 11B:
Figure 11C:
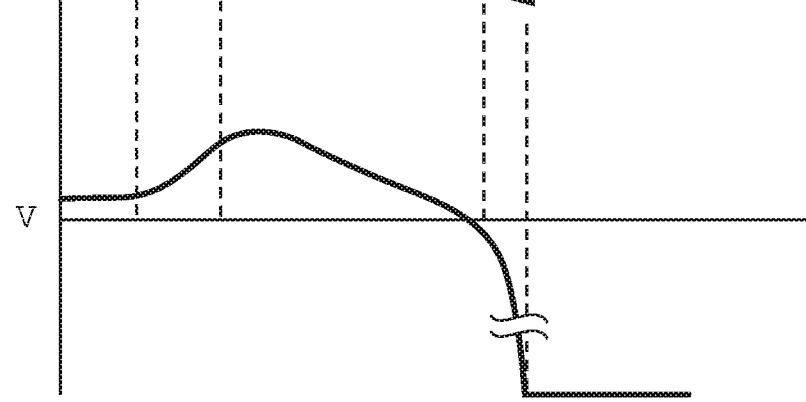

When switch S1 is active, common-source IGBT/anti-parallel diode pairs 1024 and 1026, together with negative source 1028, bring control terminal negative with respect to cathode terminal 104. FIGS. 11A, 11B, and 11C show timing diagrams for switch S1, diode current I, and diode voltage V respectively. Switch S1 turns on when pre-turn-off is desired, and turns off at the point of current- and voltage-zero-crossing. However, this requires extremely precise timing.

In some sample embodiments, at the moment of current-zero-crossing, the drift region has two to three orders of magnitude more carriers than the intrinsic concentration thereof.

Figure 12:
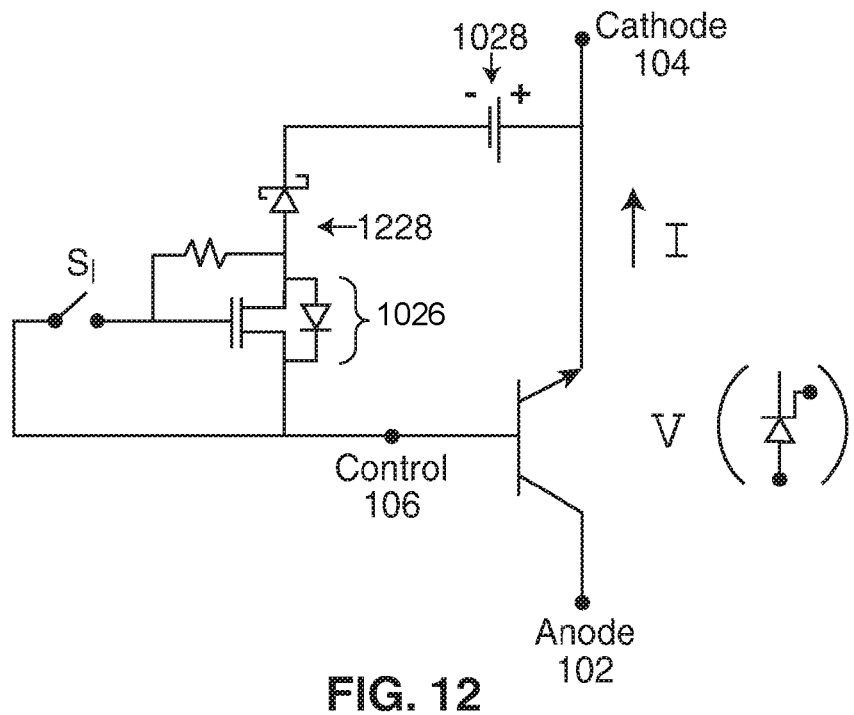
FIG. 12 shows another presently-preferred sample embodiment providing improved turn-off.
Figure 13:
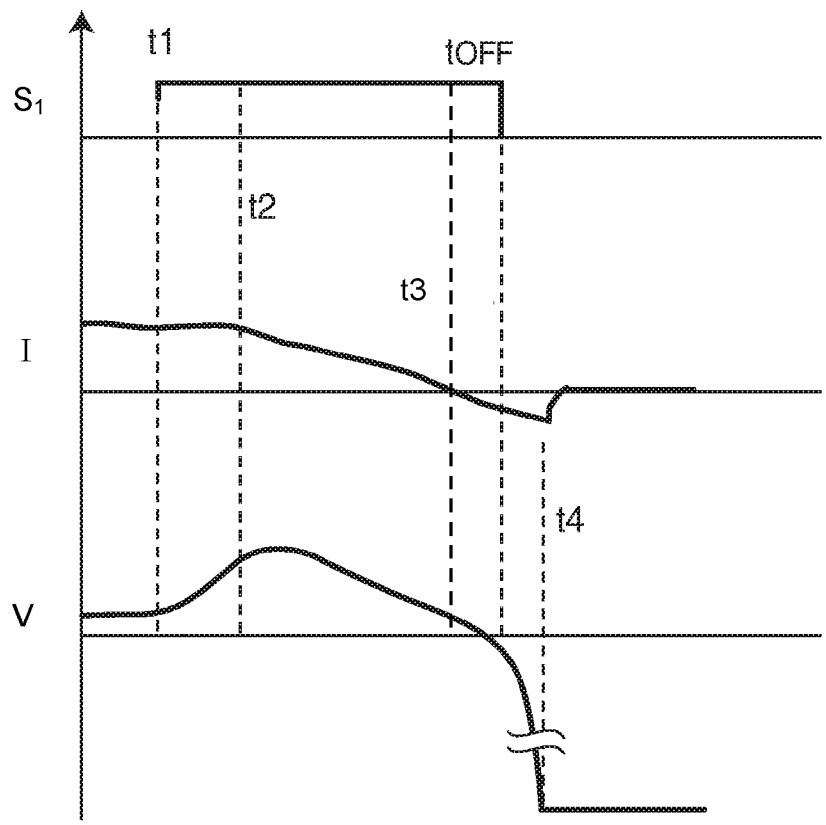
FIG. 13 shows sample timing diagrams for turn-off with the sample embodiment of FIG. 12.

The sample embodiment of FIG. 12 is the presently-most-preferred method of controlling a p-drift ACC diode. Upper diode/IGBT pair 1024 from FIG. 10 has been replaced with Schottky diode 1228. As seen in the sample timing diagrams of FIG. 13, this permits S1, which turns on at time t=t1, to turn off at time t=$t_{OFF}$. After S1 turns on at time t=t1, current I begins decreasing at time t=t2, crosses zero at time t=t3, and snaps back to zero at t=t4. While $t_{OFF}$ is shown as t3<$t_{OFF}$<t4 in FIG. 13, S1 can turn off at any time $t_{OFF}$>t3. The snapback phase t3<t<t4 is as low as 30 nanoseconds for a 650 V, compared to 45 nanoseconds for a conventional silicon diode. Again, for an n-drift diode, FIG. 12 will be adapted to instead drive control terminal 106 positive with respect to anode terminal 102.

Figure 14:
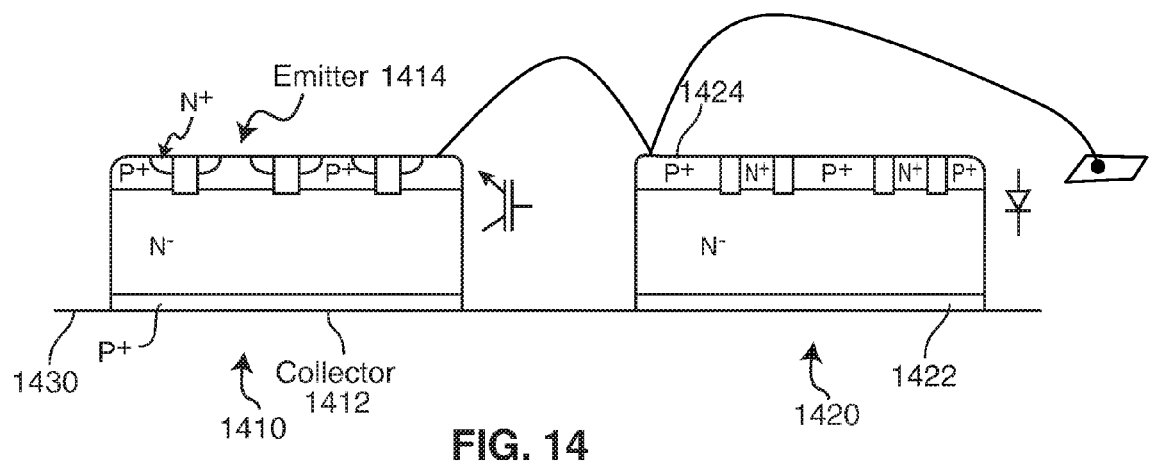
FIG. 14 shows an example of a switching module incorporating a three-terminal diode connected antiparallel with a unidirectional switching device.

FIG. 14 shows an example of a power switching module incorporating a 3-terminal diode 1420 as described above, in combination with an IGBT 1410. Note that the IGBT 1410 and the diode 1420 both use n-type substrates. Also note that, in this example, the heat sink 1430 is soldered to the collector 1412 of the IGBT and to the cathode 1422 of the diode. This provides one of the current-carrying terminals of the switching module. The emitter 1414 of the IGBT and the anode 1424 of the diode are connected together to provide the other current-carrying terminal of the switching module. The control terminals are brought out separately, so that this module provides a four-terminal switching device.

Note that, in this example, the IGBT 1410 and the diode 1420 both have n-substrates. These can be separate dice, which advantageously allows the thickness and doping of the two devices to be optimized separately. However, other arrangements are also possible.

Figure 15:
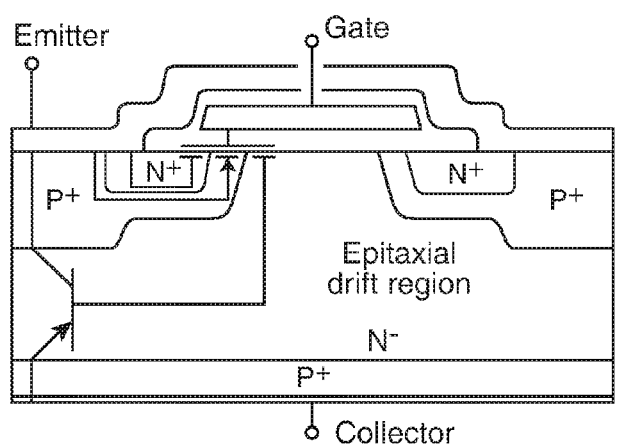
FIG. 15 shows structure of an IGBT which can be used in the module of FIG. 14.

FIG. 15 shows the structure of an IGBT which can be used in the module of FIG. 14. The disclosed diodes and methods improve reverse recovery, and can be advantageously used in combination with any unidirectional switch. For example, bipolar junction transistors or power MOSFETs often have a preferred direction of current flow, and can be advantageously connected in an antiparallel relationship with the diode.

Figure 16:
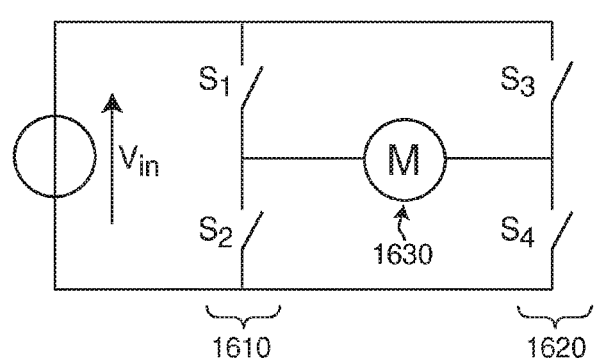
FIG. 16 shows an example of an H-bridge motor drive circuit which can use switching modules like that of FIG. 14.

FIG. 16 shows an example of an H-bridge motor drive circuit according to various disclosed inventions. The H-bridge, in this example, includes two phase legs 1610 and 1620, one for each terminal of a DC motor 1630. Each of the phase legs includes two switches, connecting its drive node to the two supply rails. Each of the switches, in this example, is the combination of a unidirectional switch (such as an IGBT) with an antiparallel freewheeling diode, which is implemented by a three-terminal diode as described above. H-bridge is a common configuration in robotics applications, for example. Here too the use of the above-described diodes and methods to implement the freewheeling diode gives improved power efficiency, less heat generation, and faster reverse recovery. The use of the above-described diodes and methods to implement phase legs also gives improved power efficiency, less heat generation, and faster reverse recovery. Finally, the use of the above-described diodes and methods to implement switching modules gives improved power efficiency, less heat generation, and faster reverse recovery. (FIG. 16 is based on "H bridge" by Cyril BUTTAY—Own work. Licensed under CC BY-SSA 3.0 via Commons—https://commons.wikimedia.org/wiki/File:H_bridge.svg#/media/File:H_b ridge.svg.)

Advantages

The disclosed innovations, in various embodiments, provide one or more of at least the following advantages. However, not all of these advantages result from every one of the innovations disclosed, and this list of advantages does not limit the various claimed inventions.

Modular structure;
Higher switching frequency;
Reduced duration of snapback phase;
Reduced peak amplitude;
Reduced total charge transfer;
Integrated current and max current are both less.

According to some but not necessarily all embodiments, there is provided: Methods and systems for active charge control diodes with improved reverse recovery characteristics. An extra control terminal is added on the side of a diode nearest to its p-n junction. The control terminal connects to a control region which extends from the drift region to the cathode surface and which is most preferably separated from the cathode region by an insulated trench. During turn-off, the control terminal is most preferably driven negative relative to the cathode just before reversing the polarity of the applied external voltage.

According to some but not necessarily all embodiments, there is provided: A phase leg, comprising: two switch+diode combinations connected together, between first and second external power terminals, at an intermediate node, and each comprising: a unidirectional semiconductor switch having first and second current-carrying terminals, which, when turned ON by a control terminal thereof, allows current to flow into the first terminal and out of the second terminal; and a controllable diode, having a first current-carrying terminal connected to the second terminal of the switch, and having a second current-carrying terminal connected to the first terminal of the switch, and having a respective control terminal; wherein, when the diode is forward biased, current flows into the first terminal and out of the second terminal; wherein the switch and the diode each comprise a respective semiconductor substrate which vertically separates the first and second current-carrying terminals; and wherein the switch and the diode each have one of the current-carrying terminals thereof connected and affixed to a shared conductive heat-sink, to thereby form a four-terminal switching module.

According to some but not necessarily all embodiments, there is provided: A switch module, comprising: a unidirectional semiconductor switch having first and second current-carrying terminals, which, when turned ON by a control terminal thereof, allows current to flow into the first terminal and out of the second terminal; and a controllable diode, having a first current-carrying terminal connected to the second terminal of the switch, and having a second current-carrying terminal connected to the first terminal of the switch, and having a respective control terminal; wherein, when the diode is forward biased, current flows into the first terminal and out of the second terminal; wherein the switch and the diode each comprise a respective semiconductor substrate which vertically separates the first and second current-carrying terminals; and wherein the switch and the diode each have one of the current-carrying terminals thereof connected and affixed to a shared conductive heat-sink, to thereby form a four-terminal switching module.

A semiconductor device, comprising: a first-conductivity-type semiconductor die, having first and second current-carrying regions of first and second conductivity types respectively located on first and second surfaces thereof, to provide one-way conduction in response to externally applied voltage; a control terminal which is ohmically connected to a first-conductivity-type control region on the second surface of the die; whereby, when a voltage which is NOT intermediate between the voltage of the first and second current-carrying regions is applied to the control terminal, the nonequilibrium carrier density in the semiconductor die is reduced.

According to some but not necessarily all embodiments, there is provided: A method of operating a semiconductor device, comprising: in the ON state, applying an external voltage between a cathode region and an anode region, to thereby conduct current therebetween as a diode; wherein the anode region is p-type and located at a first surface of an n-type semiconductor die, and the cathode region is n-type and located at a second surface of the semiconductor die; at turn-OFF, driving an n-type control region on the first surface positive with respect to the anode region, to thereby draw electrons from the bulk of the die and reduce emission of holes from the anode, before the polarity of the external voltage reverses.

According to some but not necessarily all embodiments, there is provided: A method of operating a semiconductor device, comprising: in the ON state, applying an external voltage between a cathode region and an anode region, to thereby conduct current therebetween as a diode; wherein the cathode region is n-type and located at a first surface of a p-type semiconductor die, and the anode region is p-type and located at a second surface of the semiconductor die; at turn-OFF, driving a p-type control region on the first surface negative with respect to the cathode region, to thereby draw holes from the bulk of the die and reduce emission of electrons from the cathode, before the polarity of the external voltage reverses.

According to some but not necessarily all embodiments, there is provided: A method of operating a junction diode, comprising: connecting first and second terminals, which are connected to first and second current-carrying regions located on first and second surfaces of a first-conductivity-type semiconductor die, to provide one-way conduction in response to externally applied voltage; when turning OFF from the ON state, biasing a third terminal, which is ohmically connected to the first-conductivity-type semiconductor die, to a voltage which is NOT intermediate between the voltage of the first and second terminals, to thereby reduce the carrier density in the semiconductor die; whereby the duration and/or peak magnitude and/or integrated total charge of reverse recovery current is reduced.

According to some but not necessarily all embodiments, there is provided: A method of operating a semiconductor diode, comprising: in the ON state, applying an external voltage between an n-type cathode region and a p-type anode region separated by an n-type drift region, to conduct current therebetween in dependence on the polarity of the external voltage; at turn-OFF, before the polarity of the external voltage reverses, driving an n-type control region, which is located on the same surface as the anode region, toward the voltage of the cathode region, to thereby reduce emission of holes from the anode and also drive electron current into the control terminal and thereby reduce the concentration of electrons in the drift region, to thereby reduce the total carrier concentration; whereby the duration of reverse recovery current is reduced.

According to some but not necessarily all embodiments, there is provided: A method of operating a semiconductor diode, comprising: in the ON state, applying an external voltage between an n-type cathode region and a p-type anode region separated by a p-type drift region, to conduct current therebetween in dependence on the polarity of the external voltage; at turn-OFF, before the polarity of the external voltage reverses, driving a p-type control region, which is located on the same surface as the cathode region, toward the voltage of the cathode region, to thereby reduce emission of electrons from the cathode and also drive hole current into the control terminal and thereby reduce the concentration of holes in the drift region, to thereby reduce the total carrier concentration; whereby the duration of reverse recovery current is reduced.

According to some but not necessarily all embodiments, there is provided: A bridge circuit comprising: first and second phase legs according to various disclosed embodiments, connected in parallel across first and second power supply connections, and each having a power output terminal at an intermediate node thereof.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A method of operating a semiconductor diode, comprising:
   in the ON state, applying an external voltage between an n-type cathode region and a p-type anode region separated by a p-type drift region, to conduct current therebetween in dependence on the polarity of the external voltage;
   at turn-OFF, before the polarity of the external voltage reverses, driving a p-type control region, which is located on the same surface as the cathode region, toward the voltage of the cathode region, to thereby reduce emission of electrons from the cathode and also drive hole current into the control terminal and thereby reduce the concentration of holes in the drift region, to thereby reduce the total carrier concentration;
   whereby the duration of reverse recovery current is reduced;
   wherein the step of driving the control region uses an intervening Schottky diode.

2. A method of operating a semiconductor diode, comprising:
   in the ON state, applying an external voltage between an n-type cathode region and a p-type anode region separated by a p-type drift region, to conduct current therebetween in dependence on the polarity of the external voltage;

at turn-OFF, before the polarity of the external voltage reverses, driving a p-type control region, which is located on the same surface as the cathode region, toward the voltage of the cathode region, to thereby reduce emission of electrons from the cathode and also drive hole current into the control terminal and thereby reduce the concentration of holes in the drift region, to thereby reduce the total carrier concentration;

whereby the duration of reverse recovery current is reduced;

wherein the control region is separated from the cathode region by a trench.

3. A method of operating a semiconductor diode, comprising:

in the ON state, applying an external voltage between an n-type cathode region and a p-type anode region separated by an n-type drift region, to conduct current therebetween in dependence on the polarity of the external voltage;

at turn-OFF, before the polarity of the external voltage reverses, driving an n-type control region, which is located on the same surface as the anode region, toward the voltage of the cathode region, to thereby reduce emission of holes from the anode and also drive electron current into the control terminal and thereby reduce the concentration of electrons in the drift region, to thereby reduce the total carrier concentration;

whereby the duration of reverse recovery current is reduced;

wherein the control region is separated from the anode region by a trench.

4. A method of operating a semiconductor diode, comprising:

in the ON state, applying an external voltage between an n-type cathode region and a p-type anode region separated by an n-type drift region, to conduct current therebetween in dependence on the polarity of the external voltage;

at turn-OFF, before the polarity of the external voltage reverses, driving an n-type control region, which is located on the same surface as the anode region, toward the voltage of the cathode region, to thereby reduce emission of holes from the anode and also drive electron current into the control terminal and thereby reduce the concentration of electrons in the drift region, to thereby reduce the total carrier concentration;

whereby the duration of reverse recovery current is reduced;

wherein the step of driving the control region uses an intervening Schottky diode.

5. A method of operating a junction diode, comprising:

connecting first and second terminals, which are connected to first and second current-carrying regions located on first and second surfaces of a first-conductivity-type semiconductor die, to provide one-way conduction in response to an externally applied voltage;

when turning OFF from the ON state, biasing a third terminal, which is ohmically connected to the first-conductivity-type semiconductor die, to a voltage which is NOT intermediate between the voltage of the first and second terminals, to thereby reduce the carrier density in the semiconductor die; whereby the duration of reverse recovery is reduced;

wherein said step of biasing the third terminal uses an intervening Schottky diode.

* * * * *